United States Patent [19]

Noji

[11] 4,175,259
[45] Nov. 20, 1979

[54] CONSTRUCTION OF PRESET PLATE FOR VHF TUNER

[75] Inventor: Tasuku Noji, Soma, Japan

[73] Assignee: Alps Electric Co., Ltd., Tokyo, Japan

[21] Appl. No.: 861,161

[22] Filed: Dec. 16, 1977

[30] Foreign Application Priority Data

Dec. 17, 1976 [JP] Japan .......................... 51/169081[U]

[51] Int. Cl.² .......................... H03J 5/02; H03J 1/00; H01H 19/58
[52] U.S. Cl. ...................................... 334/49; 334/51; 334/88; 200/11 EA
[58] Field of Search ...................... 334/47, 49, 50, 51, 334/88; 200/11 EA; 74/10.41

[56] References Cited

U.S. PATENT DOCUMENTS

| 3,255,319 | 6/1966 | Paine | 200/11 EA |
| 3,596,013 | 7/1971 | Pihl | 200/11 EA |

*Primary Examiner*—Alfred E. Smith
*Assistant Examiner*—Harry E. Barlow
*Attorney, Agent, or Firm*—Guy W. Shoup; Gerard F. Dunne

[57] ABSTRACT

Disclosed is a preset plate for a VHF tuner, having a first and a second rotary bodies which are unitarily mounted on a main shaft of the VHF tuner. The first rotary plate has a plurality of coils corresponding to respective channels to be selected and a number of switching contact pieces, while the second rotary body carries a plurality of fine-adjusting screws for getting into and out of the cavities of respective coils for varying the inductance thereof. Stationary contact members are fixed on the frame of the tuner for engaging the successive switching contact pieces as the preset plate is rotated around the axis of the main shaft. The second rotary body has a plurality of axially projecting portions located between each adjacent switching contact pieces for engaging the stationary contact member at a portion of the latter other than the contact area for electrical contact with the switching contact pieces, during the rotation of the preset plate, so as to move the stationary contact member away from the plane of the switching contact pieces, so as to avoid frictional sliding engagement of the switching contact pieces with the stationary contact member, thereby to avoid the wear of contacts and, accordingly, to improve durability of the preset plate.

4 Claims, 10 Drawing Figures

CONSTRUCTION OF PRESET PLATE FOR VHF TUNER

BACKGROUND OF THE INVENTION

The present invention relates to a construction of preset plate for VHF tuners and, more particularly, to a construction of such a preset plate for VHF tuners having improved durability of the contacts thereof.

Hitherto, a variety of types of preset plate for VHF tuners have been proposed, for example those described in U.S. Pat. Nos. 3,209,110 and 3,210,485, they have, however, suffered from poor durability of the contacts.

SUMMARY OF THE INVENTION

It is therefore an object of the invention to provide a preset plate for VHF tuners having an improved durability of contacts.

According to the invention, there is provided a preset plate for a VHF tuner having first and second rotary bodies mounted preferably in an overlapping manner on a main shaft, said first rotary body having a plurality of coils corresponding to respective channels to be selected and switching contact pieces for switching said coils, while said second rotary body carrying a plurality of fine adjusting screws which are adapted to be moved into and out of the cavities of respective coils, characterized by including a plurality of projecting portions on said second rotary body positioned between neighbouring switching contact pieces for engaging, in the course of the switching of the channels, resilient contacting member for cooperating with said switching contact pieces, at portions of said contacting members other than the contacting area for electrically contacting the switching contact pieces.

The above and other objects, as well as advantageous features of the invention will become clear from the following embodiment taken in conjunction with the attached drawings in which:

BRIEF DESCRIPTION OF THE DRAWINGS:

FIGS. 1 to 7 show an embodiment of the invention, wherein

FIG. 1 is a schematic sectional side elevational view of essential parts of the embodiment, FIG. 2 is a schematic illustration for explaining the second rotary body, FIG. 3 is a schematic illustration of a switching contact piece, FIG. 4 is a schematic illustration of the part of a first rotary body, FIG. 5 is a sectional exploded view taken along the line X—X of FIG. 4, FIGS. 6 and 7 are partially sectioned illustrations showing an essential part of the embodiment, for explaining the matter of operation of the latter.

FIGS. 8 and 9 show an example of conventional arrangements in which:

FIG. 8 is a partially sectioned side elevational view of essential parts, while FIG. 9 is a perspective view of a clip incorporated in FIG. 8.

DESCRIPTION OF THE PREFERRED EMBODIMENT

Before turning to the description of the preferred embodiment of the invention, a typical conventional construction will be described with specific reference to FIGS. 8 to 10, for an easier understanding of the invention of this application.

Figure 8:
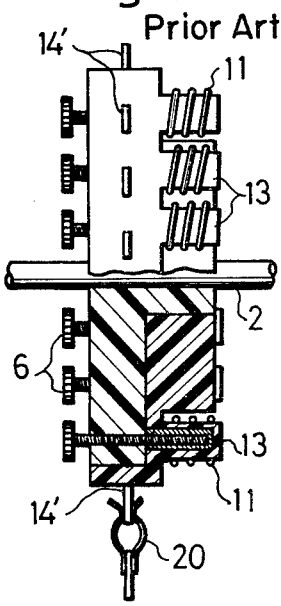
Figure 9:
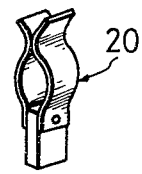

FIGS. 8 and 9 show the most popular construction of contacts on preset plates conventionally used. In this construction, the switching is performed as one of a plurality of switching contact pieces 14' is brought into and out of engagement with a clip 20 of a two-surface-contacting type, as a shaft 2 is rotated. Thus, each time the successive contact pieces 14' are put into contact with the clip 20, the clip 20 is forcibly deformed so as to bias the two legs away from each other, as the contact piece 14' slidingly gets into the gap between the two legs. Consequently, contact pieces 14' and the clip 20 are both soon worn down.

Figure 10:
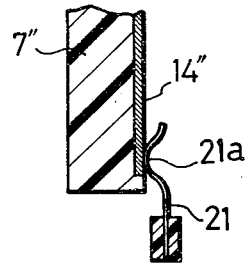
FIG. 10 is a sectional side elevational view of parts of another conventional structure.

In another typical conventional construction as shown in FIG. 10, switching contact pieces 14" are embedded in a first rotary body 7", such that the contact pieces 14" assumes the a common plane to the surface of the first rotary body. The switching contact pieces 14" are brought into contact with a stationary contact 21 having a contacting area 21a, as the rotary body 7" is rotated. Thus, the stationary contact piece 21 is alternatingly put into contact with the switching piece 14" and the rotary body 7". The rotary body 7" is typically made of a glass-fiber reinforced material and, consequently, the contact area 21a of the stationary contact wears away rapidly.

The invention aims at providing an improved preset plate in which the contacts are much more free from the wearing down so as to improve the durability of the tuner.

FIGS. 1 to 7 in combination show a preferred embodiment of the invention.

Referring to these Figures, a tuning main shaft 2 is supported by a frame 1 of a VHF tuner. The main shaft 2 in turn carries a fine-adjusting shaft 3. An intermediate gear body 4 is secured to the frame 1 through a coiled spring 5, and is adapted to transmit rotation of the fine-adjusting shaft 3 to a later-mentioned fine-adjusting screw 6, when the shaft 3 is pushed and rotated.

The present plate of the invention generally designated at A consists of a first rotary body 7 and a second rotary body 8, which are fitted to the aforementioned main shaft 2 in an overlapping manner and fixed to the main shaft 2 by suitable means for an unitary rotation therewith.

A plurality of cams 9 are formed at a peripheral portion of the second rotary body 8 (See FIG. 2), for cooperation with a spring body 10 to impart a click feeling to the rotation of the main shaft 2, the combination of the clicking cam 9 and the spring 10 is also effective to position the main shaft 2 at correct rotational positions corresponding to the channels.

A plurality of fine frequency adjusting screws 6 are screwed into and held by the second rotary body 8 and adapted to be moved back and forth within a later mentioned coils 11 to provide desired inductance of the coil. As will be seen from FIG. 2, the fine frequency adjusting screws 6 are firmly held by elastic projections 12, 12 formed on the second rotary body 8. The second rotary body 8 is made of an acetal resin (e.g. ziracon M90 from polyplastics Co., Ltd.) having a good wear-resistant property, so that the fine adjusting screws 6 may be held securely by the second rotary body 8, even after a long time of use.

Figure 1:
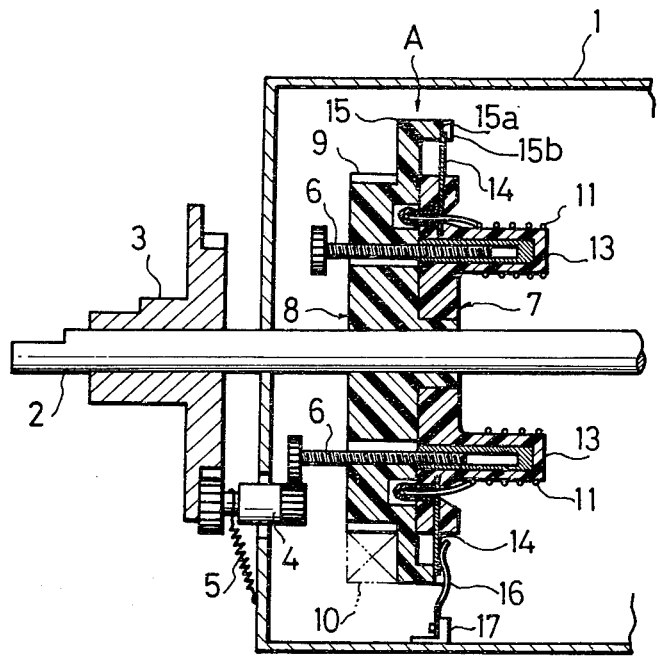
Figure 2:
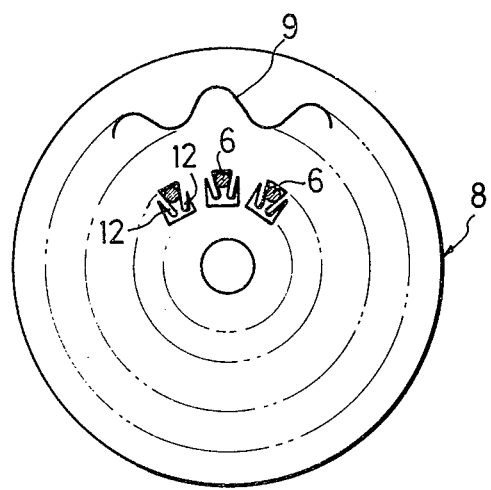
Figure 3:
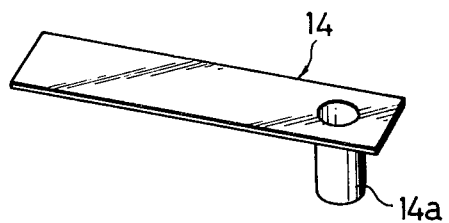
Figure 4:
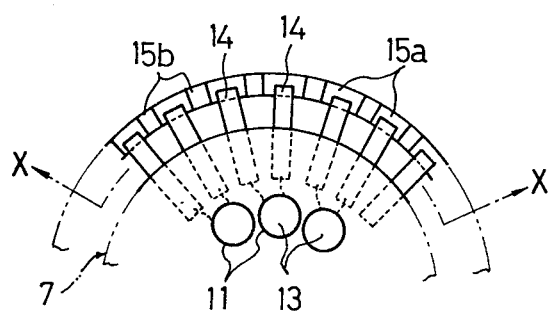
Figure 5:
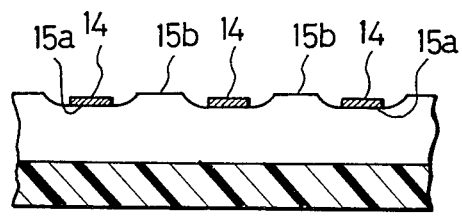
Figure 6:
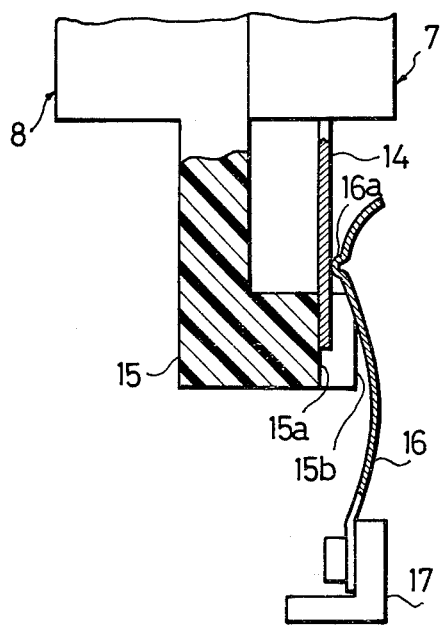
Figure 7:
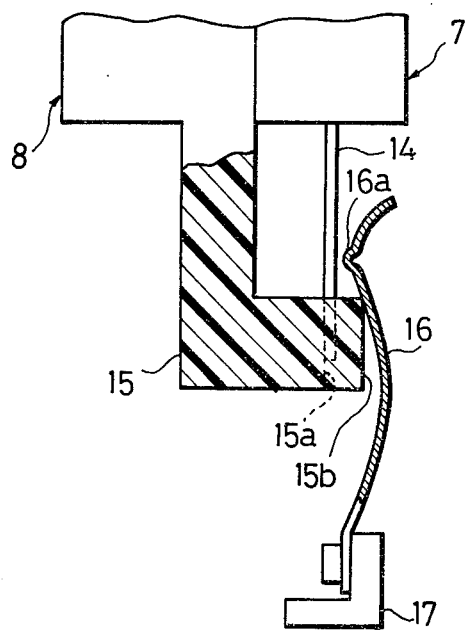

A plurality of coil bobbins 13 are formed unitarily with the first rotary body 7 and have internal cavities for allowing the aforementioned fine adjusting screws 6 to move freely back and forth. Coils 11 correspond to respective channels and are wound around respective coil bobbins 13. Numeral 14 denotes switching contact pieces each of which having one end suitably connected to respective coils 11. The switching contact pieces 14 each have a hollow fastening portion 14a formed unitarily therewith, as shown in FIG. 3. Further, as will be seen from FIG. 4, two switching contact pieces 14, 14 constitute a respective pair for each coil bobbin 13. These switching contact pieces 14 are embedded by insert-molding in the first rotary body 7, so as to have flattened end portions projected radially outwardly therefrom. The hollow fastening portion 14a of each switching contact piece 14 is made to project from the back side of the first rotary body 7, and is connected to the end of the respective coil fitted to the fastening portion 14a by means of dip-soldering.

The dip-soldering is performed for all connections between the fastening portion 14a and the coil 11, at one time. The first rotary body 7 carries coils 11 which are apt to be affected by the ambient conditions, so that the material for the first rotary body is so selected as to avoid the influences of any change of the ambient temperature, humidity and other conditions on the characteristics of the coils. Thus, for instance, a glass-fiber reinforced synthetic resin such as polyethylene telephtalate (FRTET, BN3030 from Teijin Limited, for example is suitable).

The outer extremity 15 of the second rotary body 8 has seat portions 15a for receiving the ends of the switching contact pieces 14 and axially projecting portions 15b located between neighbouring seat portions 15a. (See FIGS. 1, 4 and 5). Thus, the extremity of the second rotary body 8 serves to hold the switching contact pieces 14 at their ends and to bias later mentioned contact members 16 away from the plane of the switching contact pieces 14 in the course of the switching between the channels.

A pair of resilient contact members 16 (only one is shown for the purpose of clarification) is attached to the frame 1 through attaching pieces 17. Each contact member 16 has a contacting portion 16a adapted to be resiliently contacted by a switching contact piece 14, when the preset plate A is clicked. However, in the course of the switching, i.e. when the preset plate is at an intermediate position between clicking positions, the contact member 16 is contacted at a portion other than the contacting portion 16a, by the projecting portion 15b, as can be seen from FIG. 7. In other words, the arrangement is such that the contacting portion 16a of the contact member 16 is allowed to contact the switching contact piece 14 only when a channel has been selected, i.e. only when the preset plate A is clicked, while, in the course of the switching, the projecting portion 15b of the second rotary body 8 made of wear-resistant material contacts the contact member 16 at a portion thereof other than the contacting portion 16a, so as to lift the contact member 16. The production of ground particles attributable to the contact of both members 15b, 16 is accordingly reduced since the member 15 contains no glass-fiber. As the preset plate A is further rotated, the contact member 16 is allowed to resume its original posture, by its own resiliency, to come in contact with the next switching contact piece 14 by portion 16a of the contact member.

It will be seen that the wearing of the contact parts is remarkably reduced in the construction in accordance with the invention, as compared with conventional arrangements described in connection with FIGS. 8 to 10.

As has been described, according to the invention, projecting portions of the second rotary body are positioned between successive switching contact pieces, so as to put the projecting portions into contact with the cooperative contact members at a portion of the latter other than the contacting area. Thus, the contact area of the contact member is brought into contact with the switching contact piece only when the preset plate has been rotated to the channel-selecting position. Thus, the frictional sliding engagement of the contact member with the switching contact piece which has been inevitable in the conventional arrangement is fairly avoided to diminish the wearing of the contacts.

The decrease of the wearing down is ensured also by a fact that the contacting member is brought into contact with the switching contact piece from its lifted position, gently without substantial friction.

Thanks to these advantages, the construction of the present invention is suitable for use in VHF preset plate in which a stable functioning is required for a long period of use.

Having described the invention through a specific preferred embodiment, it is to be noted here that various modifications and changes may be imparted to the described embodiment without departing from the scope of the invention which is delimited solely by the appended claims.

What is claimed is:

1. In a preset plate for a VHF tuner, including a first rotary body and a second rotary body each adapted to be mounted on a shaft for rotation therewith, said first rotary body carrying a plurality of inductance coils each corresponding to a respective channel of the tuner and said second rotary body carrying a plurality of screws each aligned with a respective inductance coil and adapted to be positioned within its respective coil to vary the inductance thereof for providing a fine tuning of the selected channel, and means for switching between inductance coils, said switching means including contact pieces connected electrically to respective coils and carried by said first rotary body for rotation into engagement with contact portions of at least one fixed contact member; the improvement comprising said contact pieces each being embedded within said first rotary body and extending radially outwards therefrom to a free end portion, said second rotary body having an outer portion spaced radially outwards from said first rotary body, said outer portion having recessed seat portions and projecting portions between adjacent seat portions, said free end portions each lying against a respective seat portion whereby during rotation of said first and second rotary body members, said projecting portions will lift each said contact member by a camming action to disengage the contact portion thereof from said contact pieces and said first rotary body, and return each said contact portions to said contact pieces with little bounce therebetween.

2. A plate according to claim 1, said second rotary body being comprised of an acetal resin.

3. A plate according to claim 1, said first rotary body being comprised of a glass-fiber reinforced synthetic resin.

4. A plate according to claim 3, said resin being a polyethylene telephtalate.

* * * * *